United States Patent [19]
Krivokapic

[11] Patent Number: 5,879,998
[45] Date of Patent: Mar. 9, 1999

[54] ADAPTIVELY CONTROLLED, SELF-ALIGNED, SHORT CHANNEL DEVICE AND METHOD FOR MANUFACTURING SAME

[75] Inventor: Zoran Krivokapic, Santa Clara, Calif.

[73] Assignee: Advanced Micro Devices, Inc., Sunnyvale, Calif.

[21] Appl. No.: 890,388

[22] Filed: Jul. 9, 1997

[51] Int. Cl.$^6$ .................................................. H01L 21/336
[52] U.S. Cl. ........................ 438/300; 438/595; 438/589; 438/291; 438/696
[58] Field of Search .................................... 438/259, 289, 438/291, 300, 589, 595, 174, 180, 182, 184, 694, 696

[56] References Cited

U.S. PATENT DOCUMENTS

| | | |
|---|---|---|
| 4,378,627 | 4/1983 | Jambotkar . |
| 4,845,046 | 7/1989 | Shimbo . |
| 5,082,794 | 1/1992 | Pfiester et al. . |
| 5,116,780 | 5/1992 | Samata et al. . |
| 5,242,847 | 9/1993 | Ozturk et al. . |
| 5,270,232 | 12/1993 | Kimura et al. . |
| 5,298,445 | 3/1994 | Asano . |
| 5,434,093 | 7/1995 | Chau et al. . |
| 5,494,837 | 2/1996 | Subramanian et al. . |
| 5,545,579 | 8/1996 | Liang et al. . |
| 5,571,738 | 11/1996 | Krivokapic ................................. 437/44 |
| 5,668,021 | 9/1997 | Subramanian et al. ................. 438/282 |

OTHER PUBLICATIONS

Denton, et al., Fully Depleted Dual–Gated Thin–Film SOI P–MOSFET's Fabricated in SOI Islands with an Isolated Buried Polysilicon Backgate, IEEE Electron Device Letters, vol. 17, No. 11, Nov. 1996.

*Primary Examiner*—Mary Wilczewski
*Attorney, Agent, or Firm*—Fliesler, Dubb, Meyer & Lovejoy LLP

[57] ABSTRACT

A short channel semiconductor device having source and drain regions in a substrate and a gate region on the top surface of the substrate between the source and drain regions is disclosed. In one embodiment, the method comprises: forming a device area in the silicon by forming a pattern stack, and forming pattern spacers adjacent to the pattern stack; forming a trench isolation about the pattern stack; removing the pattern spacers; depositing an epitaxial layer over the trench oxide and adjacent to the pattern stack; removing the pattern stack; and forming adaptively controlled spacers in the region to control said short channel length of the device.

The apparatus of the present invention comprises: a semiconductor substrate; a source region and a drain region formed in the substrate; a gate region, comprising a first and a second oxide regions, a first control spacer and a second control spacer positioned above the substrate and adjacent to the first and second oxide regions, respectively, and a polysilicon layer positioned between the spacers; and an epitaxial layer, adjacent to the source and drain region and surrounding said first and second spacers.

20 Claims, 5 Drawing Sheets

ADAPTIVELY CONTROLLED, SELF-ALIGNED, SHORT CHANNEL DEVICE AND METHOD FOR MANUFACTURING SAME

CROSS-REFERENCE TO RELATED APPLICATIONS

SHORT CHANNEL TRANSISTOR HAVING RESISTIVE GATE EXTENSIONS, U.S. patent application Ser. No. 08/890,104, filed Jul. 9, 1997, inventor Zoran Krivokapic, owned by the assignee of the present application.

METHOD AND APPARATUS FOR A SEMICONDUCTOR DEVICE WITH ADJUSTABLE THRESHOLD VOLTAGE, U.S. patent application Ser. No. 08/891,422, filed Jul. 9, 1997, inventor Zoran Krivokapic, owned by the assignee of the present application.

These applications are specifically incorporated herein by reference.

BACKGROUND OF THE INVENTION

1. Field of the Invention

The present invention generally relates to the field of semiconductor devices and more particularly to an adaptively controlled, self-aligned, short channel semiconductor device and method for manufacturing the same.

2. Description of the Related Art

The trend in the semiconductor industry is to reduce the geometry of semiconductor devices to thereby increase the number of such devices available in a given area (increased density) of an integrated circuit (IC) chip. As the integration degree of semiconductor devices becomes higher, the device size must be reduced. The increased density of semiconductor devices in a given area of an IC chip results in an increased performance by the IC chip including faster operating speeds and lower power consumption necessary to supply the IC chip.

The size of a semiconductor device such as a transistor is in large part dependent on the length of the "channel" of the transistor, that is, a thin region of the device that supports conduction. A conventional semiconductor device known as a silicon gate metal oxide ("MOS") field effect transistor 5 (MOS transistor) depicting a channel region is shown in prior art FIG. 1. (In the attached figures, it should be understood that the thicknesses are not represented to scale and the cross-sections are exaggerated for clarity in the explanation of the invention). The MOS transistor is formed on a silicon wafer 10, typically a P-type wafer. The silicon wafer 10 is doped with an N-type impurity to form a source region 15 and drain region 20, with the distance between the source and drain regions defining the channel length 25 of the MOS transistor 5. Isolation oxide regions 30 isolate the MOS transistor 5 from other devices on the wafer. The gate structure 35 is composed of a polysilicon region 40 and a gate oxide 45. A deposited oxide layer 46 surrounds the gate structure 35, while conductive metal layers 50 are coupled to the source, drain and gate to couple the device to other devices on the IC.

Channel lengths, such as the channel length 25 of FIG. 1, are currently defined in the submicron region. State of the art devices currently have channel lengths ranging from approximately 0.18 μm to 0.25 μm. The trend discussed above to reduce the geometry of semiconductor devices has resulted in attempts to reduce the channel length of a semiconductor device to dimensions below 0.1 μm and even down to 0.05 μm. However, as the channel lengths of these devices are reduced, problems with the design, operation and fabrication of the devices occur. Features such as lightly doped-drain (LDD) extension regions, having a lower impurity concentration than the source and drain regions, solve some of the operational problems associated with short-channel devices but other problems, including that of the accuracy of equipment currently employed to fabricate devices, remain.

One such problem is the alignment of the source and drain regions of a semiconductor device around such a small channel length (down to 0.05 μm). Prior art FIG. 1 shows that the source and drain regions meet the gate oxide region 45 of the gate region 35 at reference points 55 producing a shorter effective channel length of the device. When the device is formed, there is some overlap by the gate region over the source and drain regions. Generally, any such overlap becomes a region of unwanted capacitance. It is well known to employ self-alignment of the source and drain regions to the gate regions by forming the gate region first and then aligning the source and drain regions around the gate region. However, with ever smaller devices, processing limitations make such alignment move difficult A further limitation on size reduction concerns photolithography equipment and techniques currently employed. Such equipment is limited in resolution and by physical factors such as reflection and resist mask chemistry.

In a standard, prior art process for forming a transistor such as that shown in FIG. 1, two masks are used to define the device. The first mask defines a window of silicon with an isolation oxide, while a second mask defines where the polysilicon gate will be located. Overlay errors (the error in the alignment of the polysilicon mask in respect to the isolation mask), can become significant once device dimensions become very small (such as, for example, a maximum error of 0.75 μm on a 0.2 μm length of diffusion area EPROM). Hence, in a worst case, source resistance would only be 45% of drain resistance, which is not an acceptable design feature of the device. Typical photoresist masks, when applied to reflective films such as polysilicon or silicon, are difficult to accurately pattern due to the reflectivity of the films, making it difficult to control line widths and other critical dimensions. Subsequent etching of the underlying films such as polysilicon can introduce more variations. Hence, with channel lengths below 0.1 μm, there remain several difficult manufacturing problems.

In U.S. Pat. No. 5,571,738 invented by Zoran Krivokapic issuing Nov. 5, 1996 (Krivokapic), the channel length of a transistor is controlled by varying the thickness of an insulation spacer layer. Krivokapic discloses one technique for using insulation layers to define the effective channel length in the range of 0.35 μm by varying the insulation layer from about 300 to 1,000 Å. Krivokapic teaches a method for forming a relatively conventional cross-section of a raised source/drain MOS transistor. There is a need for a semiconductor device and method for making the same device that ensures that, even at sub-0.1 μm dimensions, there is very little overlap in the source/drain and gate.

Still another problem is the electrical interference between the close source, gate and drain contacts due to the short channel length. As the channel length 25 of FIG. 1 becomes shorter, it is clear that the metalization layers 50 will continue to move closer together and thereby cause electrical interference between the contacts. There is therefore a need to separate the drain, source and gate contacts to avoid electrical interference as the channel length is reduced.

A further problem is that non-planarized contacts of the source, drain and gate regions at the contact mask level result in an uneven topography that may cause excessive over etching of the silicide layer overlying the polysilicon. Increasing chip density has placed more components on the wafer surface, which in turn, has decreased the area available for surface wiring. The answer to this dilemma has been dual and triple level layer connection schemes, with numerous layers of dielectric and metal layers. Multilevel layer schemes are simple in concept but present one of the semiconductor technology's biggest challenges of forming a planarized device. A device with a multilevel layer design will be dense and have a number of etched surface layer, leaving a topology of different step heights and a mix of surfaces. The type of surface requires planarization techniques to minimize thinning of deposited conduction layers over the steps and allow precise imaging. A need therefore exists to have a fully planarized device at the contact mask level to make the device more reliable.

A still further problem is the cost of purchasing new equipment capable of manufacturing devices with such short channel lengths. To accomplish the move to smaller geometries at a relatively feasible cost, the same equipment used in the fabrication of the devices used to manufacture 0.25 $\mu$m must be reusable at these geometries down to 0.05 $\mu$m.

The present invention is directed to overcoming one or more of the problems as set forth above.

SUMMARY OF THE INVENTION

In accordance with the present invention, the method of manufacturing a short channel semiconductor device having source and drain regions in a substrate and a gate region on the top surface of the substrate between the source and drain regions is disclosed. In one embodiment, the method comprises: forming a device area in the silicon by forming a pattern stack, and forming pattern spacers adjacent to the pattern stack; forming a trench isolation about the pattern stack; removing the pattern spacers; depositing an epitaxial layer over the trench oxide and adjacent to the pattern stack; removing the pattern stack; and forming adaptively controlled spacers in the region to control said short channel length of the device.

In a further embodiment, the adaptively controlled spacers are composed of a nitride, and may have a width of between about 0.05 $\mu$m and 0.15 $\mu$m.

In accordance with a further embodiment of the present invention, a semiconductor apparatus is disclosed. The apparatus comprises: a semiconductor substrate; a source region and a drain region formed in the substrate; a gate region, comprising a first and a second oxide regions, a first control spacer and a second control spacer positioned above the substrate and adjacent to the first and second oxide regions, respectively, and a polysilicon layer positioned between the spacers; and an epitaxial layer, adjacent to the source and drain region and surrounding said first and second spacers.

The method and apparatus provide a novel method of providing a very short channel transistor structure using conventional photolithography and semiconductor processing techniques.

Other objects, features, and advantages of the present invention will become apparent upon consideration of the following detailed description and the accompanying drawings in which like reference designations represent like features throughout the figures.

BRIEF DESCRIPTION OF THE DRAWINGS

The invention will be described with respect to the particular embodiments thereof. Other objects, features, and advantages of the invention will become apparent with reference to the specification and drawings in which:

FIGS. 2–3A and 4–9 are cross-sectional views depicting the semiconductor device and a method of manufacturing the semiconductor device of the present invention;

DETAILED DESCRIPTION OF THE PREFERRED EMBODIMENTS

Reference is now made in detail to the specific embodiments of the present invention, which illustrate the best mode presently contemplated by the inventor for practicing the invention.

Figure 1:
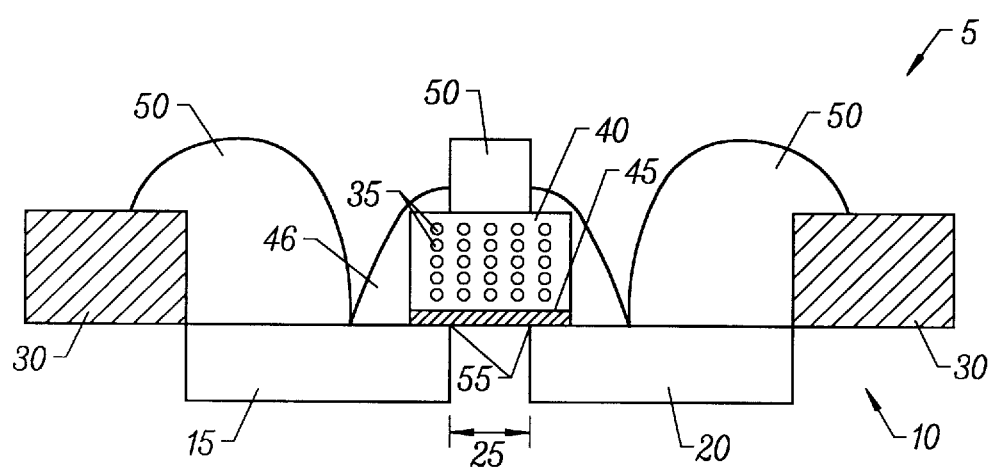
FIG. 1 is a cross-sectional view of a prior art semiconductor device known as a silicon gate metal oxide field effect transistor.
Figure 2:
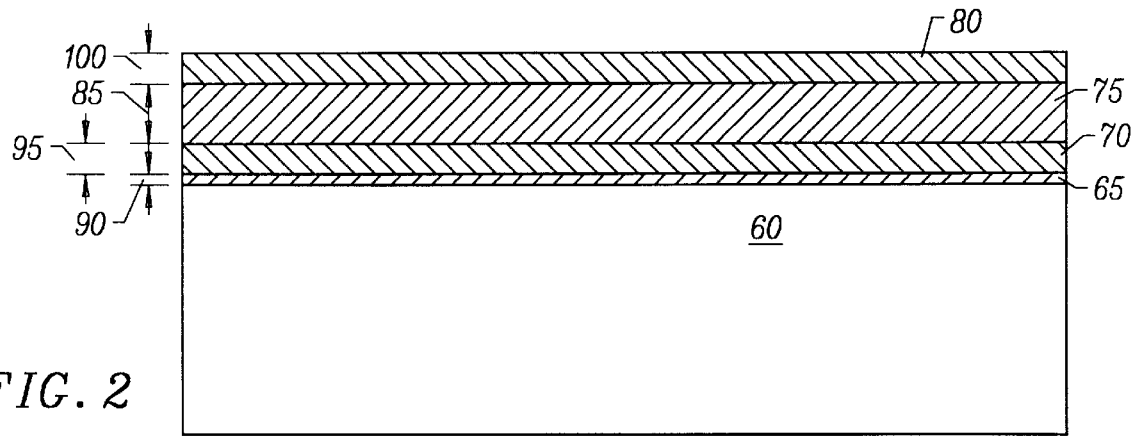

FIGS. 2–3A and 4–9 are cross-sectional views of a series of steps for manufacturing a semiconductor device in accordance with the present invention. On the top surface of a silicon substrate 60, a first oxide layer 65 is formed. The first oxide layer has a first oxide layer height 90 of between 0.01 $\mu$m to 0.03 $\mu$m. The first oxide layer 65 is typically composed of silicon dioxide ($SiO_2$) formed by conventional thermal oxidation techniques. Sequentially deposited on top of the first oxide layer 65 is a first nitride layer 70 having a height 95 of between about 0.05 $\mu$m to 0.07 $\mu$m. The first nitride layer is typically composed of silicon nitride ($Si_3N_4$) and is deposited using conventional chemical vapor deposition (CVD) or other technique. After depositing the first nitride layer 70, a second oxide layer 75, composed of, for example, $SiO_2$, is sequentially deposited on the first nitride layer 70 and has a second oxide layer height 85 of between about 0.3 $\mu$m to 0.4 $\mu$m. A final second nitride layer 80 is then deposited on top of the second oxide layer 75. The second nitride layer may be composed of, for example, $Si_3N_4$ and has a second nitride layer height 100 of between 0.15 $\mu$m to 0.2 $\mu$m. The layers formed as depicted in FIG. 2 are deposited on the substrate in a conventional manner, typically by thermal oxidation and low pressure chemical vapor deposition, or other suitable techniques.

Figure 3A:
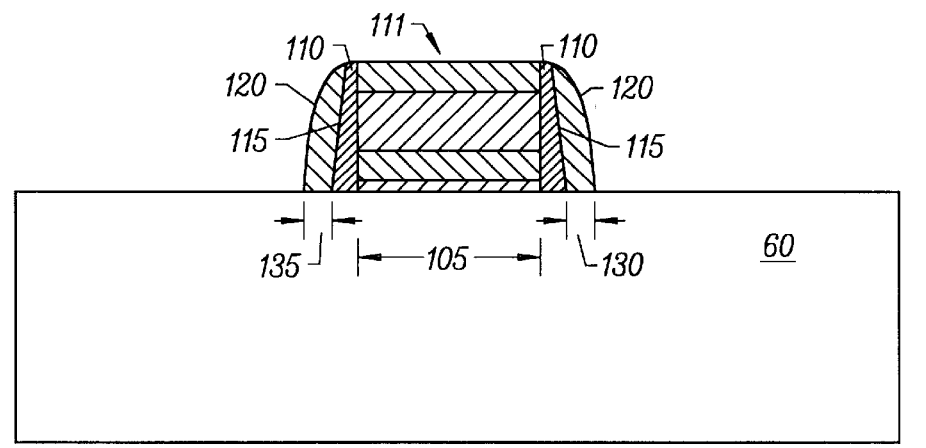

FIG. 3A is a cross-sectional view of the semiconductor device of the present invention after further steps of the method for manufacturing the semiconductor device of the present invention have been performed. These layers have been masked to leave an active area length 105. The first oxide layer 65, the first nitride layer 70, the second oxide layer 75, and the second nitride layer 80 are then etched to form a stack structure 111, defined by length 105.

Figure 3B:
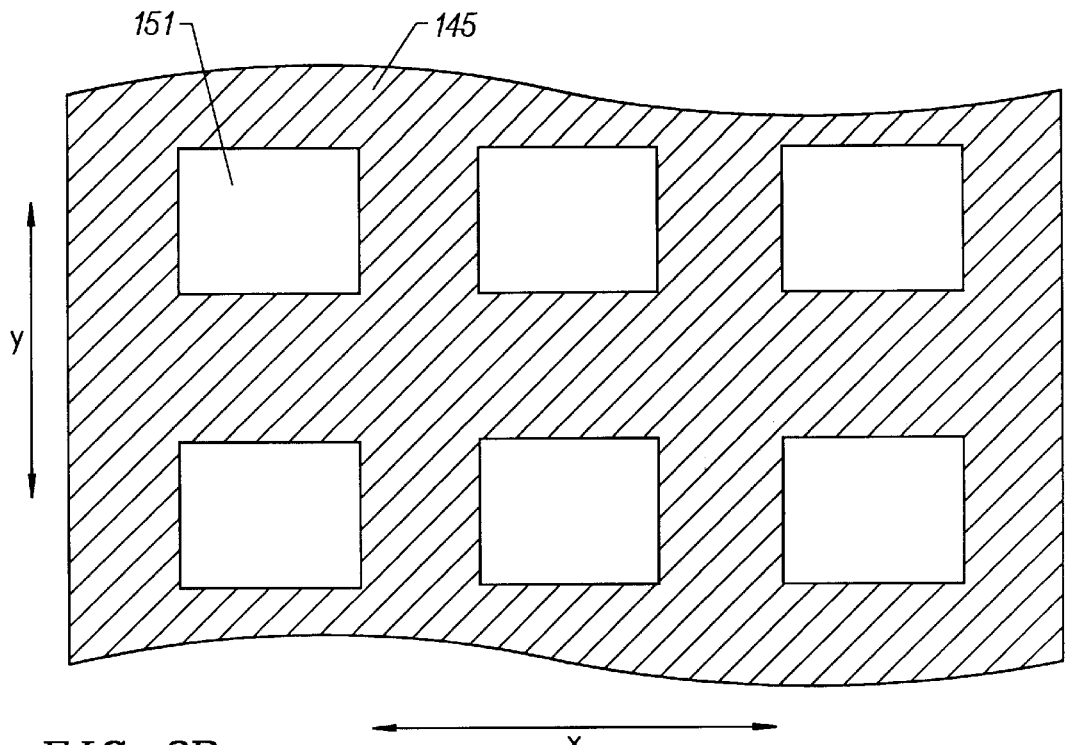
FIGS. 3B and 3C are plan views of the semiconductor device of the present invention depicting the isolation steps utilized to define devices in the X- and Y- directions on the substrate of the present invention.
Figure 3C:
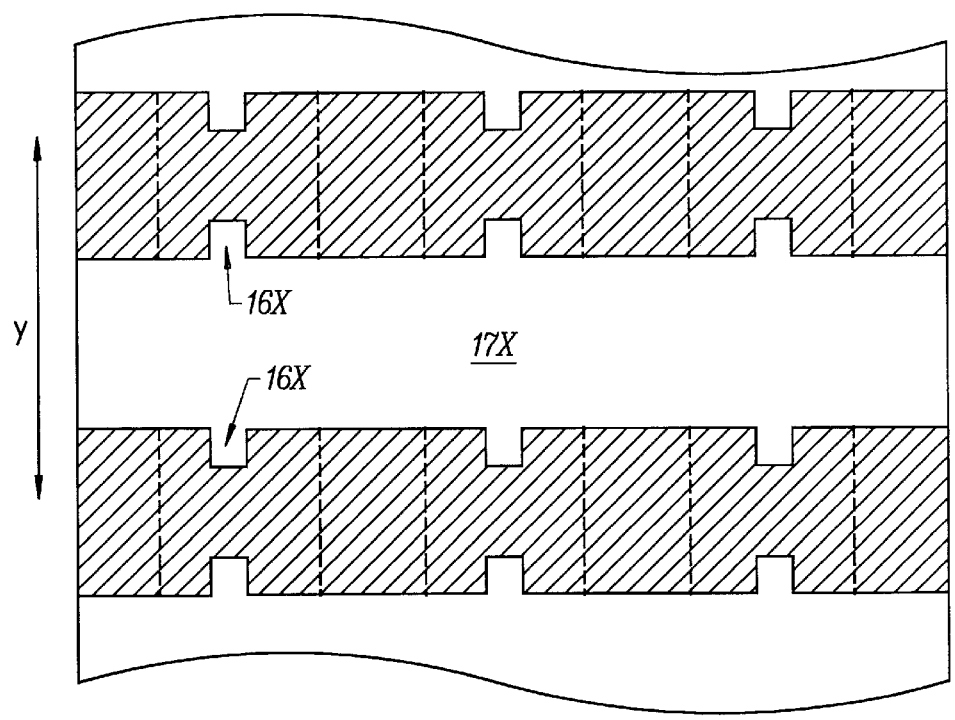

FIGS. 3B and 3C show a top view of the semiconductor device of the present invention illustrating etching of the pattern stack. For reference, it should be understood that FIGS. 2–3A and 4–15 represent views of a device along the X direction shown in FIG. 3. Initially, as shown in FIG. 3B, a device mask 145 is utilized to open windows 151 where the pattern stack will be defined by etching. This area forms diffusion regions of the devices and where the trench isolation (FIG. 4) will be formed. The device mask defines the area along the Y direction (or width) of each device. The four-layer stack—the first oxide layer 65, the second oxide layer 75, the first nitride layer 70 and the second nitride layer 80—is then etched in these regions.

Following formation of the stack 111, as shown in FIG. 3A, a first oxide spacer 110 along the height of the stack structure is formed. The first oxide spacer layer 110 is formed by depositing a spacer oxide layer by furnace Tetra-ethyl orthosilicate process such as (TEOS) (not shown) having a thickness of about 0.02–0.03 µm and an anisotropically etching the spacer oxide layer to form oxide spacers 110. An alternative approach would be to deposit oxide layer 110 by chemical vapor deposition to a thickness of about 0.01 µm–0.02 µm and etch the layer back to form spacers 110.

First oxide spacers 110 have a lateral surface 115 along the height of the first oxide spacer layer 110. A first set of nitride spacers 120 are then formed adjacent to lateral surface 115 of the first oxide spacers by depositing a nitride layer (not shown) through a conventional CVD process to a thickness of about 0.08–0.15 µm and an anisotropically etching the spacer nitride layer. The first nitride spacer layer 120 has a first nitride spacer layer lateral surface 125. The first oxide spacer layer length 130 may be between 0.01 µm to 0.02 µm while the first nitride spacer layer length 135 is may be between 0.08 µm and 0.15 µm.

With reference to FIGS. 3B and 3C, the first nitride spacers 120 have the effect of reducing the effective width of the windows 151. Next the device width isolation mask 146 is formed. This mask defines where the trench reaches in the X direction. The mask reaches into windows 151 to remove portions of the nitride spacer in squares 16X and the four-layer stack in region 17X.

Figure 4:
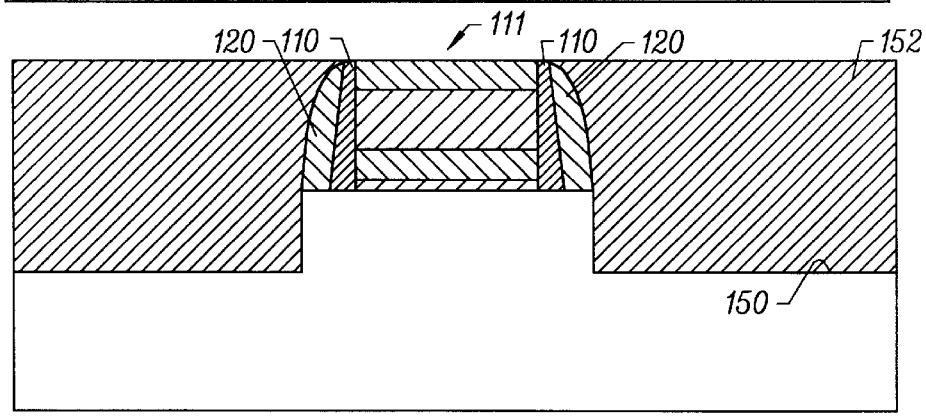

FIG. 4 illustrates the resulting structure after a trench etch and oxide fill. Trench 150 is formed into the substrate 60 by a silicon etch of substrate 60 to allow for isolation of the semiconductor device. The trench 150 is preferably etched into the substrate to a trench oxide etch depth 155 of between 0.2 µm to 0.4 µm deep. Subsequently, device isolation is formed in the trench by, for example, a TEOS process depositing oxide 152 in trench 150. The trench oxide 152 has a thickness of about 0.8 to 1.5 µm. The top surface 160 of the trench oxide 152 is then polished to even the upper surfaces of oxide 152 and the second nitride layer top surface 165. The polishing is performed using one of many available conventional chemical mechanical polishing methods.

Figure 5:
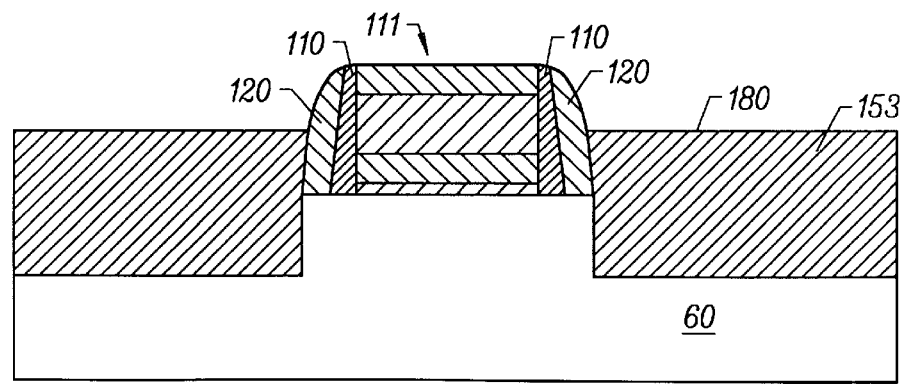
Figure 6:
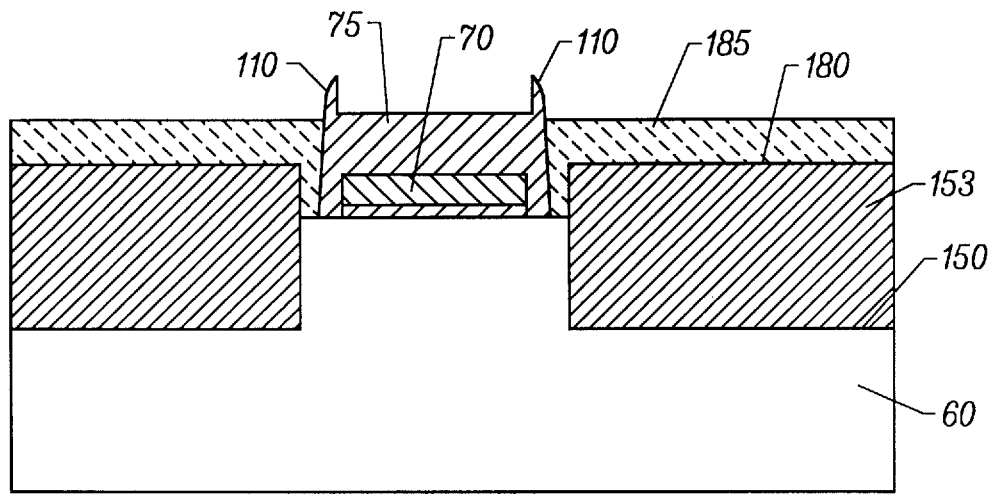

FIGS. 5 and 6 are a cross-sectional view of the semiconductor device of the present invention after additional steps for forming the semiconductor device. In FIG. 5, the trench oxide 152 shown in FIG. 4 is etched to a lower trench oxide 153 by about 0.2–0.3 µm, defining a lowered trench oxide top surface 180. Subsequently, as shown in FIG. 6, a conventional plasma wet etch process is utilized to remove second nitride layer 80 and first nitride spacers 120. A selective epitaxial overgrowth layer (EOL) 185 is then performed on the lowered trench oxide top surface 180. As will become clear through the following steps, provision of the epitaxial silicon at this point in the process produces a conduction and diffusion path to the source and drain regions which will be formed in the device during later process steps, eliminating the need for separate source and drain plugs, as in the '738 patent.

Figure 7:
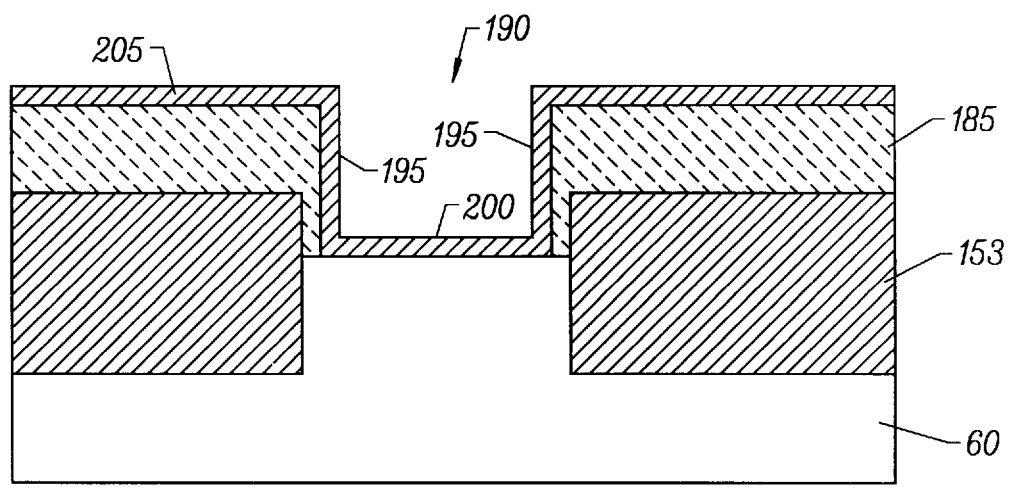

FIG. 7 is a cross-sectional view of the semiconductor device of the present invention after additional steps for manufacturing the device have been performed. In FIG. 7, the second oxide layer 75 and the first oxide spacer 110 have been removed by etching to form a gate region 190. Removal of these layers leaves gate region sidewalls 195 and a gate region bottom 200. A third oxide layer 205 is formed along said gate region sidewalls and above the selective epitaxial lateral overgrowth layer 185. A third oxide layer is formed to insulate the gate region 190. The third oxide layer has a third oxide layer thickness of between 0.01 µm to 0.03 µm. Subsequently, the first nitride layer 70 is removed by a selective etch process.

Figure 8:
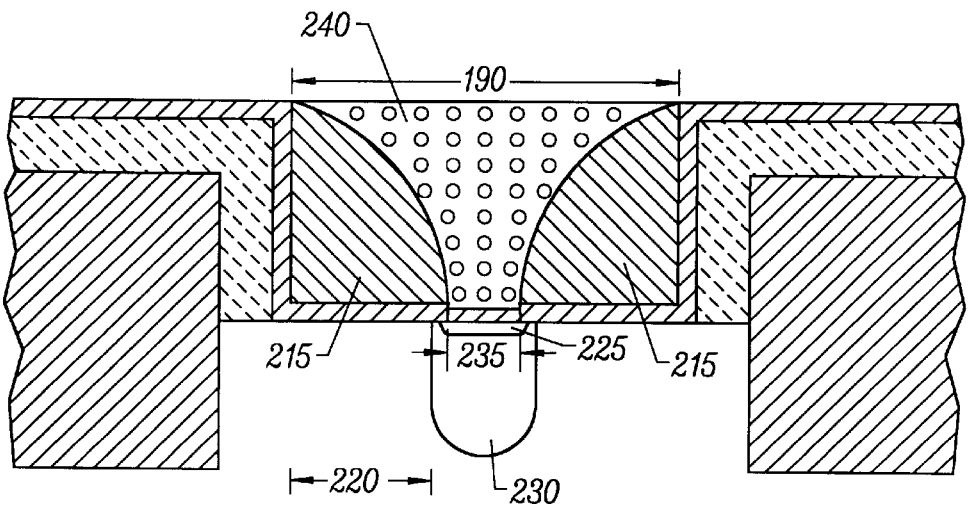

FIG. 8 is cross-sectional view of the semiconductor device of the present invention after additional steps for manufacturing the device have been performed. Adaptively controlled spacers 215 are formed and deposited within the gate region 190. These adaptively controlled spacers 215 are formed by depositing a $Si_3N_4$ (or $Si_xN_y$) layer having a thickness of about 0.05–0.15 µm using conventional techniques and anisotropically etching the layer to form spacers 215. The thickness of the spacers will defined by width 105—the thickness will be about one-half of the difference between the nominal channel length and length 105.

The adaptively controlled spacers 215 are preferably composed of silicon nitride ($Si_3N_4$) and have adaptively controlled spacer width 220 of between 0.05 µm to 0.15 µm. Two channel implants are then performed to further control short channel effects in the device by implanting impurities into the substrate using conventional methods. A first implant, the threshold voltage implant 225, is generally to a junction depth on the order of about 0.02–0.04 µm while the punch through stop implant 230 is to a junction depth of about 0.05 to 0.2 µm. The shallower, $V_t$ implant will define the channel properties of the device by the optimization of the threshold voltage ($V_t$). The second punch through implant prevents lowering potential between the source and drain, and allows one to obtain very low leakage current during the off-state of the device.

Subsequently, the first oxide layer 65 is removed from the channel length region 235 by an oxide etch and a transistor gate oxide layer with a thickness of between about 0.0015 µm to 0.003 µm is formed. Such gate oxide is typically $SiO_2$ but may also be a nitride or oxinitride. Next, the polysilicon layer 240 is deposited with the gate region adjacent to the adaptively controlled spacers 215 to form the transistor gate. The polysilicon layer is typically within a range of 0.3 µm to 0.5 µm. Lastly, the device depicted in FIG. 8 is polished using conventional methods.

Figure 9:
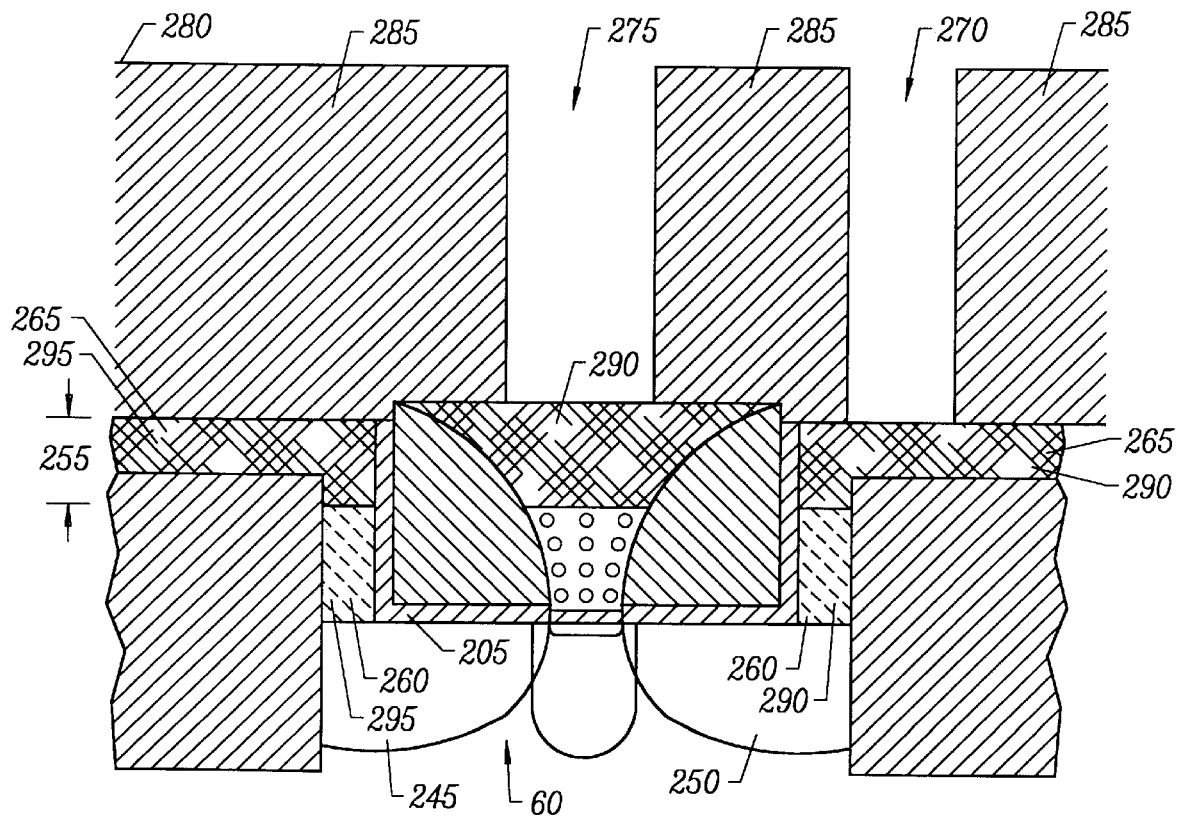

FIG. 9 is a cross-sectional view of the semiconductor device of the present invention after additional method steps have been completed. Initially, an oxide etch is used to remove those portions of the third oxide layer 205 overlying the selective epitaxial lateral overgrowth layer 185 (shown in FIG. 7). Next, a source region 245 and a drain region 250 are formed by doping the substrate 60 with N-type ions via epi-layer 185. As is well known to one of average skill, deposition or implantation of an impurity into the epitaxial silicon layer 185 and subsequent will cause diffusion of the impurity through the epitaxial layer into substrate 60, thereby forming source region 245, and drain region 250. A low energy implant of, for example, $5 \times 10^{15} – 1 \times 10^{16} atm/cm^3$ followed by a drive in step of heating the device at a temperature of 900°–1050° C. for approximately 0.5–1.0 minute will form source region 245 and drain 250. As the energy of the implant is relatively low, dopant implanted in the gate will not pass through the gate oxide.

Subsequently, a local interconnect layer 265 is formed on epi-layer 260 to provide conductive connections to metal contacts 280, 270. The local interconnect layer 265 is composed of a silicide. It is further noted that the local interconnect layer 265 and the final selective epitaxial overgrowth layer 260 compose the source contact layer 295. Likewise, the final selective epitaxial overgrowth layer 260 and the local interconnect layer 265 connecting the source to drain 250 to the drain contact 270 form the drain contact layer 290.

The local interconnect layer 265 and epitaxial layer 185 raise the source 245 and drain 250 regions to the drain contact 270, the gate contact 275, and the drain contact 280. Further, the local interconnect layer 265 distances the contacts 270, 275 and 280 from one another to avoid electrical interference.

The contacts are formed by depositing an oxide layer 285 and masking the field oxide layer at 270, 275 and 280 to deposit such areas with metalization to form the source 280, gate 275 and drain 270 contacts. A gate silicide 290 is formed at the same time the local interconnect layer is deposited. The gate silicide covers the gate structure.

Hence, the method of the present invention provides unique advantages in forming extremely short channel length devices using conventional techniques and is simpler than prior art processes employed for the same purpose.

Although this invention has been described with its preferred forms of manufacture in its preferred final form with a certain degree of particularity, it will be appreciated by those skilled in the art that the present disclosure of the preferred embodiments have been made only by way of example and that numerous changes in the details of parts and of the method portions may be resorted to without departing from the spirit and scope of the invention as claimed below.

What is claimed is:

1. A method of manufacturing a short channel semiconductor device, comprising:
   (A) forming a device area in the silicon by:
      (1) forming a pattern stack;
      (2) forming pattern spacers adjacent to the pattern stack;
   (B) forming a trench isolation about the pattern stack;
   (C) removing the pattern spacers;
   (D) depositing an epitaxial layer over the trench isolation and adjacent to the pattern stack;
   (E) removing the pattern stack to define a device region; and
   (F) forming channel control spacers in the device region, each channel control spacer having a width selected to control a channel length in said short channel device.

2. The method of claim 1 wherein said control spacers are composed of a nitride.

3. The method of claim 2 wherein said control spacers have a width of between about 0.05 $\mu$m and 0.15 $\mu$m.

4. The method of claim 1 wherein said step A(1) comprises the sub-steps of:
   sequentially depositing a first oxide layer, a first nitride layer, a second oxide layer and a second nitride layer on said substrate, each said layer having a layer length, a layer width and a layer height, said second nitride layer having a second nitride layer top surface;
   masking the layer length of said first and second oxide layers and said first and second nitride layers; and
   etching the first oxide layer, first nitride layer, second nitride layer and second oxide layer.

5. The method of claim 1 wherein said step (A)(2) comprises the sub-steps of:
   (i) forming oxide spacers about the pattern stack; and
   (ii) forming nitride spacers about the oxide spacers.

6. The method of claim 5 wherein:
   said step (i) comprises:
      forming a first oxide spacer layer along the pattern stack, said first oxide spacer layer having a first oxide spacer lateral surface,
      selectively masking said first spacer oxide layer, and etching said first oxide spacer layer; and
   said step (ii) comprises:
      forming a first nitride spacer layer along the pattern stack, said first nitride spacer layer having a first nitride spacer lateral surface, and
      etching said first nitride spacer layer.

7. The method of claim 1 wherein said step (B) comprises:
   forming an oxide trench into said substrate;
   depositing a trench oxide into said oxide trench, said trench oxide having a trench oxide top surface; and
   polishing the trench oxide top surface to said second nitride layer.

8. The method of claim 1, further including the step, between said steps (B) and (C), of:
   removing a portion of the trench oxide layer to form a lowered trench oxide layer.

9. The method of claim 1 further including the step of:
   (G) forming a source and drain region by depositing an impurity into the epitaxial layer and heating the substrate.

10. The method of claim 9 further including the step of:
    (H) forming a local interconnect layer coupled to said source and drain regions.

11. The method of claim 1 wherein said control spacers have a width of between about 0.05 $\mu$m and 0.15 $\mu$m.

12. A method for making a semiconductor device, comprising:
    (A) sequentially depositing a first oxide layer, a first nitride layer, a second oxide layer and a second nitride layer on said substrate, each said layer having a layer length, a layer width and a layer height, said second nitride layer having a second nitride layer top surface;
    (B) etching the layer length of said first and second oxide layers and said first and second nitride layers to form pattern stack on the surface of the substrate;
    (C) forming a first oxide spacer along the pattern stack;
    (D) forming a first nitride spacer along the first oxide spacer;
    (E) etching an oxide trench into said substrate;
    (F) depositing a trench oxide into said oxide trench;
    (G) etching said trench oxide, said second nitride layer and said first nitride spacer layer to remove said second nitride layer and said first nitride spacer layer and form a lowered trench oxide having a lowered trench oxide top surface;
    (H) forming a selective epitaxial overgrowth layer on said lowered trench oxide top surface and on said substrate;
    (I) removing said second oxide layer, said first nitride layer and said first oxide spacer layer to form a gate region, said gate region having gate region sidewalls adjacent to said selective epitaxial overgrowth layer and a gate region bottom overlying said first oxide layer;
    (J) selectively depositing control spacers within said gate region; and
    (K) implanting an impurity into the epitaxial layer and diffusing the impurity to form a source region and a drain region within said substrate.

13. The method of claim 12 further including the step, following step (J), of implanting an impurity to form a threshold voltage implant region.

14. The method of claim 12 further including the step, following step (J), of implanting an impurity to form a punch through stop implant region.

15. The method of claim 12 further including the steps, following step (J), of:
   (J1) forming gate oxide layer;
   (J2) depositing a polysilicon layer within said gate region, said polysilicon layer being adjacent to said adaptively controlled spacers; and
   (J3) polishing said polysilicon layer to a level coincident with the control spacers.

16. The method of claim 12 wherein said step (C) comprises depositing a spacer oxide layer and selectively masking said spacer oxide layer, said first oxide spacer layer having a first oxide spacer lateral surface.

17. The method of claim 12 wherein said step (D) comprises depositing a spacer nitride layer and selectively masking said spacer nitride layer, said first nitride spacer layer having a first nitride spacer lateral surface.

18. The method of claim 12, further including the step, after step (J), of implanting an impurity into the epitaxial layer s within said substrate, said implants including a threshold voltage implant and a punch through stop implant.

19. The method of claim 12 further including the steps, following step J, of:
   (J1) forming implants within said substrate, said implants including a threshold voltage implant and a punch through stop implant;
   (J2) forming gate oxide layer;
   (J3) depositing a polysilicon layer within said gate region, said polysilicon layer being adjacent to said adaptively controlled spacers;
   (J4) polishing said polysilicon layer to said third oxide layer; and
   (J5) forming source and drain regions overlapping said gate region by implanting a first conductivity type into said substrate.

20. The method of claim 12, further including the step of:
   forming a local interconnect layer above said final selective epitaxial overgrowth layer.

* * * * *